United States Patent
Kang et al.

(10) Patent No.: US 8,492,251 B2
(45) Date of Patent: Jul. 23, 2013

(54) METHOD OF FORMING A THIN LAYER STRUCTURE

(75) Inventors: Jong-Hoon Kang, Seoul (KR);
Bong-Jin Kuh, Suwon-si (KR);
Tae-Gon Kim, Seoul (KR); Han-Mei Choi, Seoul (KR); Ki-Chul Kim, Seongnam-si (KR); Eun-Young Jo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/596,339

(22) Filed: Aug. 28, 2012

(65) Prior Publication Data
US 2013/0115760 A1    May 9, 2013

(51) Int. Cl.
*H01L 21/20* (2006.01)
(52) U.S. Cl.
USPC ........... 438/509; 438/164; 438/199; 438/221; 438/225; 257/66; 257/E21.409; 257/E29.255; 257/355
(58) Field of Classification Search
USPC ............... 438/478, 164, 199, 221, 225, 275, 438/294–297, 404–406, 412, 425, 438, 479, 438/149–153, 300; 257/66, E21.409, E29.255, 257/351
See application file for complete search history.

(56) References Cited

U.S. PATENT DOCUMENTS

| | | | |
|---|---|---|---|
| 7,538,351 B2 * | 5/2009 | Chen et al. ...................... | 257/67 |
| 7,888,197 B2 * | 2/2011 | Chidambarrao et al. ..... | 438/221 |
| 2001/0027744 A1* | 10/2001 | Dietze ............................. | 117/89 |
| 2003/0190791 A1* | 10/2003 | Fischetti et al. .............. | 438/305 |
| 2006/0148154 A1* | 7/2006 | Shin et al. ..................... | 438/198 |
| 2007/0032025 A1* | 2/2007 | Brunco et al. ................ | 438/300 |
| 2008/0076236 A1* | 3/2008 | Chiang et al. ................ | 438/509 |
| 2008/0157091 A1* | 7/2008 | Shin et al. ....................... | 257/66 |
| 2011/0212600 A1* | 9/2011 | Wang ............................ | 438/478 |
| 2012/0025201 A1* | 2/2012 | Wann et al. ..................... | 257/76 |

FOREIGN PATENT DOCUMENTS

| | | |
|---|---|---|
| JP | 3369304 | 11/2002 |
| JP | 4119439 | 5/2008 |
| KR | 10-2010-0113317 | 10/2010 |

\* cited by examiner

*Primary Examiner* — N Drew Richards
*Assistant Examiner* — Ankush Singal
(74) *Attorney, Agent, or Firm* — Volentine & Whitt, PLLC (57) ABSTRACT

A thin layer structure includes a substrate, a blocking pattern that exposes part of an upper surface of the substrate, and a single crystalline semiconductor layer on the part of the upper surface of the substrate exposed by the pattern and in which all outer surfaces of the single crystalline semiconductor layer have a <100> crystallographic orientation. The thin layer structure is formed by an SEG process in which the temperature is controlled to prevent migration of atoms in directions towards the central portion of the upper surface of the substrate. Thus, sidewall surfaces of the layer will not be constituted by facets.

17 Claims, 8 Drawing Sheets

FIG. 16

METHOD OF FORMING A THIN LAYER STRUCTURE

CROSS-REFERENCE TO RELATED APPLICATIONS

This application claims the benefit of Korean Patent Application No. 10-2011-0116174 filed on Nov. 9, 2011 in the Korean Intellectual Property Office, the disclosure of which is hereby incorporated by reference in its entirety.

BACKGROUND

1. Field

The inventive concept relates to a thin layer structure and to an epitaxial method of forming the same. In particular, the inventive concept relates to a structure comprising a thin layer of single crystalline semiconductor material and to a method of forming the same by a selective epitaxial growth process.

2. Description of the Related Art

Single crystalline semiconductor layers are used throughout the semiconductor arts in various ways. For example, a three-dimensional (3D) architecture has been suggested for semiconductor devices as a way to secure a high degree of integration for the devices, and the manufacturing of such 3D semiconductor devices may include an epitaxial growth process of forming a thin single crystalline semiconductor layer on a semiconductor substrate. However, it is difficult to grow a thin single crystalline semiconductor layer uniformly such that it is free of defects especially at sidewall surfaces thereof.

SUMMARY

According to one aspect of the inventive concept, there is provided a thin layer structure for a semiconductor device that includes a substrate having an upper surface, a pattern disposed on the substrate and exposing part of the upper surface of the substrate, and a single crystalline semiconductor layer on the part of the upper surface of the substrate exposed by the pattern, and in which all of the outer surfaces of the single crystalline semiconductor layer have <100> crystallographic orientations, respectively.

According to another aspect of the inventive concept, there is provided a thin layer forming method that includes forming at an upper portion of a substrate a pattern that exposes part of an upper surface of the substrate, loading the substrate having the pattern thereon onto a susceptor in a process chamber, and forming a thin layer on the exposed part of the surface of the substrate such that all outer surfaces of the layer have <100> crystallographic orientations, respectively. The thin layer is formed by a selective epitaxial growth (SEG) process in a process chamber. The SEG process includes: supplying reaction source gas into the process chamber, and effecting a temperature control over at least one cycle of a first time period and a second time period that follows the first time period chronologically, and characterized in that the duration of the second time period is shorter than that of the first time period, the temperature of the substrate is maintained at one temperature throughout the entire duration of the first time period, and the temperature of the substrate is raised from said one temperature to a second temperature during the course of the second time period.

According to still another aspect of the inventive concept, there is provided a thin layer forming method that includes loading into a process chamber a substrate whose upper surface is of single crystalline semiconductor material and is partly exposed by dielectric material, supplying into the process chamber reaction source gas comprising atoms to be deposited onto the exposed part of the upper surface of the substrate, preheating the substrate during an initial stage of a selective epitaxial growth (SEG) process, and effecting a deposition of the atoms from the reaction source gas onto the exposed part of the upper surface of the substrate by controlling the temperature of the substrate during a subsequent state of the SEG process such that the temperature alternates between one temperature and a second temperature higher than said one temperature. The subsequent stage of the SEG process is characterized in that the second temperature is one at which the atoms will be deposited onto the upper surface of the substrate, the temperature of the substrate is maintained at said one temperature during the entire course of each of several first time periods, the substrate is heated to the second temperature from said one temperature during the course of each of several second time periods, and each of the second time periods is of a second duration that is shorter than the duration of each of the first time periods.

BRIEF DESCRIPTION OF THE DRAWINGS

The inventive concept will be more clearly understood from the following detailed description of the preferred embodiments taken in conjunction with the accompanying drawings.

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will be understood that although the terms first, second, and third are used herein to describe various temperatures, the magnitudes of these temperatures are obviously not limited by these terms. These terms are only used to distinguish one temperature from another.

Other terminology used herein for the purpose of describing particular examples or embodiments of the inventive concept is to be taken in context. For example, the terms "comprises" or "comprising" when used in this specification specifies the presence of stated features, elements or processes but does not preclude the presence or additional features, elements or processes. Also, unless otherwise specified, all technical and scientific terms used herein have the same meaning as commonly understood by those of ordinary skill in the art pertaining to the inventive concept.

Figure 1:
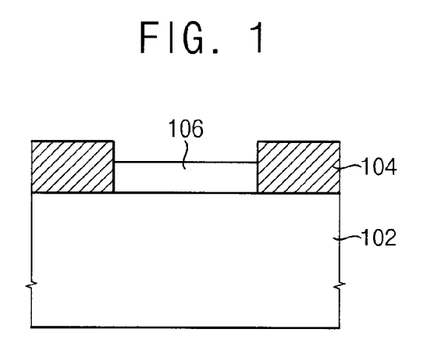
FIG. 1 is a cross-sectional view of a thin layer structure in accordance with inventive concept.

An embodiment of a thin layer structure in accordance with the inventive concept will now be described in detail with reference to FIG. 1.

The thin layer structure includes a substrate 102 comprising a semiconductor material such as a single crystalline silicon substrate. In this example, the substrate 102 (or at least the upper portion thereof) has a substantially <100> crystal orientation.

A blocking pattern 104 is disposed on the substrate 102. The blocking pattern 104 is preferably of dielectric material and may comprise at least one of a silicon oxide layer, a silicon nitride layer and a silicon oxynitride layer. Thus, the blocking pattern 104 may consist of a single layer of material or may be a multilayered structure in which at least two layers are stacked one atop the other.

A single crystalline semiconductor layer 106 extends over that portion of the substrate 102 which is not be covered by the blocking pattern 104. In this embodiment, the single crystalline semiconductor layer 106 comprises a layer of silicon, silicon germanium or silicon carbide.

All of the sidewall surfaces of the single crystalline semiconductor layer 106 contact side surfaces of the blocking pattern 104, respectively, such that no sidewall surface of the single crystalline semiconductor layer 106 is exposed. Rather, only an upper surface of the single crystalline semiconductor layer 106 is exposed. To this end, the sidewall surfaces of the single crystalline semiconductor layer 106 are not made up of any crystal facets and thus, the sidewall surfaces are not spaced apart from the side surfaces of the blocking pattern 104.

That is, if the sidewalls of the single crystalline semiconductor layer 106 were to be constituted by facets, gaps would exist between the sidewall surfaces of the single crystalline semiconductor layer 106 and the blocking pattern 104, i.e., portions of the sidewall surfaces of the single crystalline semiconductor layer 106 would be exposed. Furthermore, the crystal orientation of such facets would differ from the crystal orientation of the upper surface of the substrate 102. For example, in a case in which the upper surface of the substrate 102 has a <100> crystal orientation, the facets constituting the sidewall surfaces of the single crystalline semiconductor layer 106 would have a <311> or a <110> crystal orientation. In this case, such facets would produce crystal defects in the single crystalline semiconductor layer 106.

A method of forming the thin layer structure, whose sidewall surfaces are not constituted by any crystal facets, will now be described in detail with reference to FIGS. 2 to 4.

Figure 3:
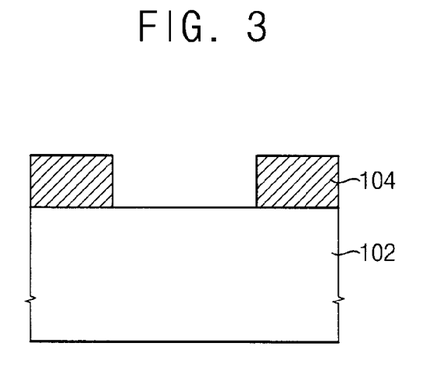
FIGS. 3 and 4 are cross-sectional views, respectively, of a substrate during a method of forming the thin layer structure illustrated in FIG. 1, in accordance with the inventive concept.

Referring first to FIG. 3, a substrate 102 comprising semiconductor material such as single crystalline silicon is prepared. In this example, the upper portion at least of the substrate 102 has a <100> crystal orientation.

The substrate 102 is then covered with blocking material, e.g., at least one of a layer of silicon oxide, a layer of silicon nitride and a layer of silicon oxynitride as mentioned above. The blocking material is then patterned to form the blocking pattern 104 that exposes part of the upper surface of the substrate 102.

Figure 4:
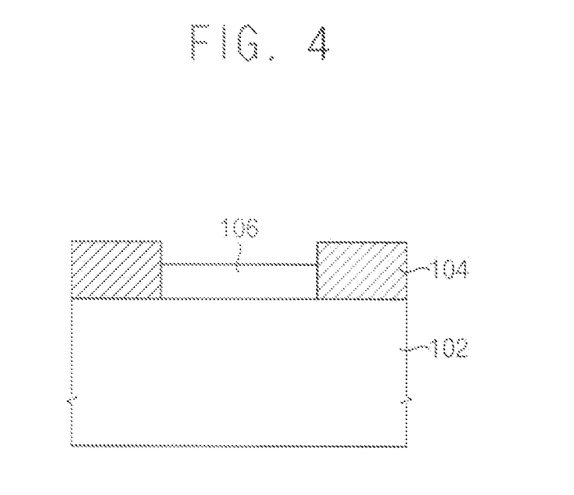

Referring to FIG. 4, the substrate 102 is then subjected to an SEG (selective epitaxial growth process) to form single crystalline semiconductor layer 106 on the exposed surface of the substrate 102.

An example of apparatus for performing the SEG process will now be described in detail with reference to FIG. 2.

The apparatus for performing the SEG process includes a process chamber 10 in which the SEG process is performed, an inlet 12 through which reaction source gas for the SEG process is supplied into the chamber 10, an outlet 14 through which reaction products and residuals of the SEG process are discharged from the chamber 10.

The apparatus also includes a susceptor 16 in the process chamber 10. The susceptor 16 supports the substrate W during the SEG process.

Also, in this example, a first heater 18 is disposed below the susceptor 16 and faces a rear surface of the susceptor 16 as spaced therefrom. Thus, the substrate W can be heated by radiant heat given off by the first heater 18 and conducted to the substrate W by the susceptor 16. The first heater 18 may be a halogen lamp or a hot plate. For reasons that will be clearer from the description of the method that follows, the first heater 18 may be operated (cycled) for first periods of time each within a range of from a few seconds to several tens of seconds.

A second heater 20 is disposed above the susceptor 16 so as to face a front surface of the susceptor 16. Thus, the substrate W can be heated by radiant heat given off by the second heater 20. The second heater 20 may include an arc lamp and a laser annealing apparatus. In addition, and again for reasons that will be clearer from the description that follows, the second heater 20 may be operated (cycled) for second periods of time each within a range of a few micro-seconds to a few hundred micro-seconds.

Furthermore, although both of the first and the second heaters 18 and 20 have been described and shown as being disposed in the process chamber 10, either of the first and the second heaters 18 and 20 may disposed outside the process chamber 10. In this case, at least a portion of the process chamber 10 may comprise quartz through which the heat given off by the heater disposed outside the chamber 10 may be transmitted into the chamber 10.

The temperature at which the SEG process is carried out may be accurately controlled using the above-described apparatus in such a way that atoms of the reaction gas may physiochemically combine with the substrate 102 without having first migrated. Thus, the single crystalline semiconductor layer 106 may be formed on the substrate 102 without any facets forming the sidewall surfaces of the layer 106.

Figure 5:
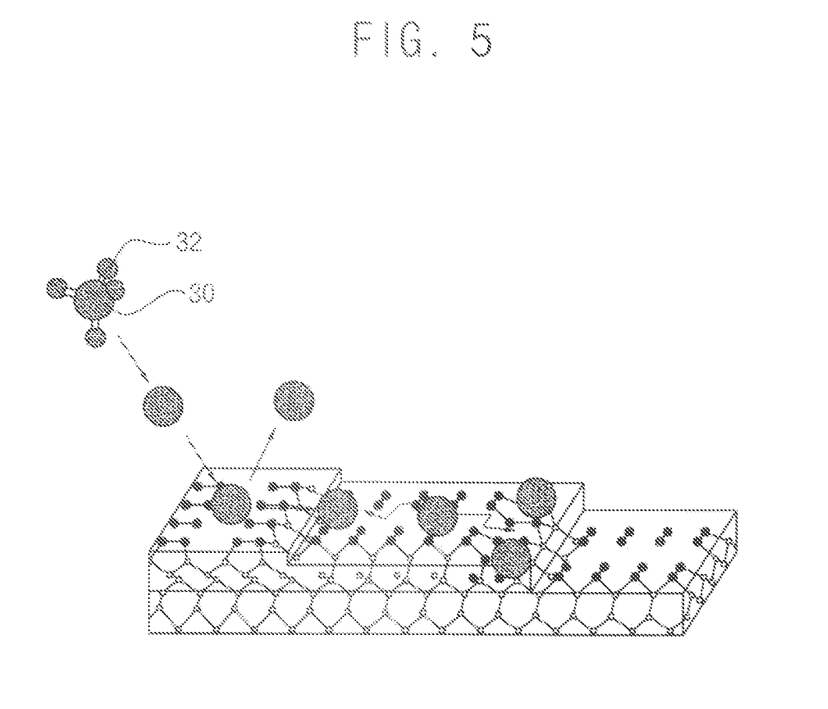
FIG. 5 is a conceptional diagram illustrating atomistic mechanisms that occur during and as a result of the SEG process.
Figure 6:
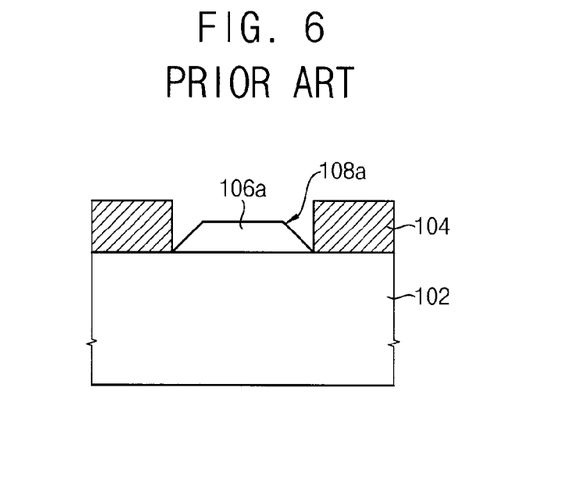
FIG. 6 is a cross-sectional view illustrating a defective thin single crystalline semiconductor layer.

This concept will now be explained in more detail with reference to FIGS. 5 and 6. FIG. 5 illustrates some of the atomistic mechanisms, namely, absorption, detachment, migration and rearrangement, by which an SEG process may occur.

Referring first to FIG. 5, the reaction source gas of the SEG process decomposes into central atoms 30, which will form the thin layer, and a plurality of ligands 32 around the central atoms 30. The central atoms 30 are absorbed by the substrate 102 and some of the central atoms detach from the substrate 102. In addition, atoms will be rearranged at the surface of the substrate in such a way that some of the absorbed central atoms 30 combine with the substrate 102. Others of the absorbed central atoms 30 migrate along surfaces of the substrate 102 until they reach locations at which they combine with the substrate 102. That is, in the cases of rearrangement and migration the central atoms 30 will physiochemically combine with the substrate 102, thereby forming an SEG layer on the substrate 102. In this deposition process, the central atoms 30 continue to combine with the substrate 102 (directly or through layers/islands of the SEG layer) until the SEG layer is grown upwards to a predetermined thickness, i.e., until the single crystalline semiconductor layer 106 of a desired thickness is grown on the substrate 102.

However, unless accounted for, the rate at which the SEG layer grows varies across the exposed surface of the substrate 102 in dependence on the proximity of the exposed surface of the substrate 102 to the blocking pattern 104. Local differences of the growth rate of the SEG layer can give rise to the creation of crystal facets. This phenomenon will be explained with reference to FIG. 6.

In an SEG process in which the temperature of the process is not especially controlled, the SEG layer tends to grow more rapidly at the central portion of the exposed surface of a substrate 102 than at the lateral portion of the exposed surface of the substrate 102 adjacent a blocking pattern 104.

In one respect, heat tends to cause the atoms absorbed at the sidewall surfaces of the single crystalline semiconductor layer to migrate to the upper surface thereof during the SEG process. Thus, fewer atoms are deposited at the lateral portion of the exposed surface of the substrate 102 than at the central portion thereof. In this case, the single crystalline semiconductor layer 106a is formed with slanted or inclined sidewall surfaces 108a having a <110> or <311> crystal orientation, whereas the upper surface of the defective single crystalline semiconductor layer 106a has a <100> crystal orientation.

That is, differences in the growth rate of the SEG layer across the exposed surface of the substrate 102 create facets at the sides of the single crystalline semiconductor layer 106a.

According to an aspect of the inventive concept, migration of atoms to the upper surface having the <100> crystallographic orientation is minimized for reducing defects in the single crystalline semiconductor layer.

An SEG process according to the inventive concept, that prevents facet defects of the type described with reference to FIG. 6 from occurring, will be described in more detail with reference to FIGS. 2 and 7.

Figure 7:
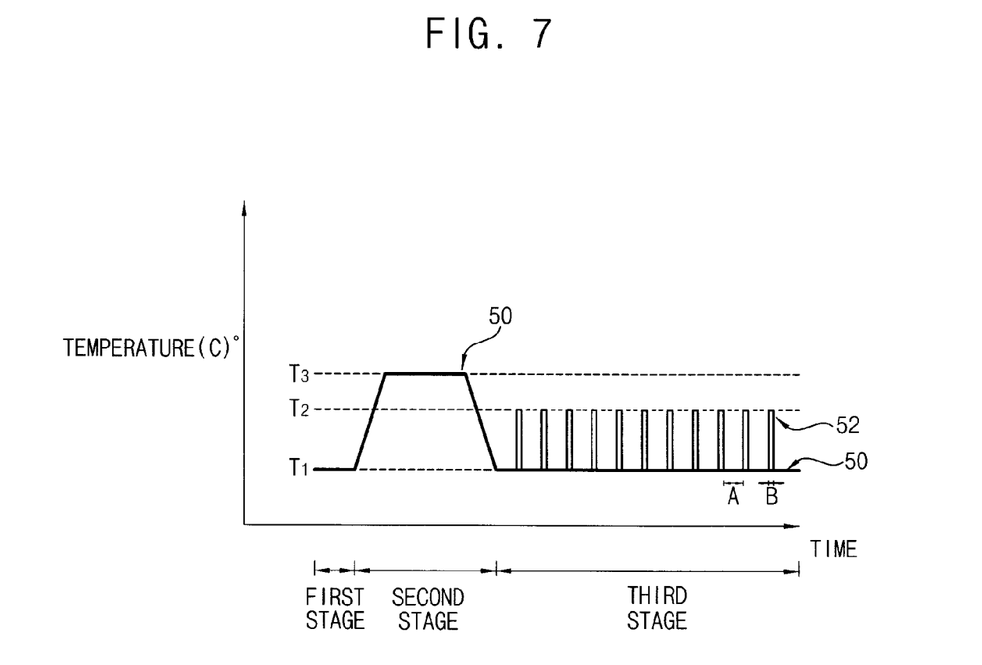
FIG. 7 is a timing diagram of the temperature control performed by the apparatus of FIG. 2 in an SEG process of a method of forming a single crystalline semiconductor layer according to the inventive concept.

In FIG. 7, reference numeral 50 denotes a temperature profile of the SEG process as regulated by the first heater 18, and reference numeral 52 denotes a temperature profile of the SEG process as regulated by the second heater 20.

As shown in FIG. 7, only the first heater 18 is operated during a first stage of the SEG process and so the rear surface of the susceptor 16 is radiantly heated. As a result, the substrate W is maintained at a constant first temperature T1 during the first stage, to thereby thermally stabilize the substrate W. The first temperature T1 is one at which the reaction source gas tends to decompose, for example, into central atoms and ligands as was explained with reference to FIG. 5. Thus, an absorption of atoms by and a detachment of some of the absorbed atoms from the substrate 102 is facilitated during the first stage. However, the first temperature T1 is lower than the temperature (referred to herein as the deposition temperature) at which atoms are rearranged on or the central atoms migrate along surfaces of the substrate 102. That is, substantially none of the central atoms combine with the surface of the substrate 102. For example, when the substrate 102 is a single crystalline silicon substrate, and the thin layer structure to be formed is a single crystalline silicon layer, the first temperature T1 is in a range of from about 400° C. to about 500° C.

Then, a native oxide layer is removed from the surface of the substrate 102 by a heat treatment performed during a second stage of the SEG process, to thereby facilitate an accelerated growth of the single crystalline semiconductor layer 106. In this embodiment, hydrogen gases (H2) and reduction gases are supplied into the process chamber 10 and the substrate 102 is heated to a temperature T3 greater than the first temperature T1 by the first heater 18. At this time, the substrate W is still heated by just the first heater 18, i.e., without the use of the second heater 20.

For example, the temperature T3 is in a rage of about 900° C. to about 1,000° C. Furthermore, the temperature T3 is higher than the deposition temperature at which the atoms are rearranged on the surface of the substrate W and thus, central atoms may combine with the surface.

The reaction source gas is supplied into the process chamber 10 at a third stage of the SEG process. The reaction source gas may be supplied continuously during the entire time that the third stage is being performed.

In the present embodiment in which the single crystalline semiconductor layer 106 comprises silicon (Si), e.g., in the case in which a single crystalline silicon (Si) layer, a single crystalline silicon germanium (SiGe) layer or a single crystalline silicon carbide (SiC) layer is to be formed, the reaction source gas includes silicon (Si) atoms. For example, the reaction source gas may comprise at least one gas selected from the group consisting of mono silane (SiH4), disilane (Si2H6), dichloro silane (DCS, SiH2Cl2), hexachloro disilane (HCD), bis(ethlymethylamino) silane (BEMAS), bis(diethylamino) silane (BDEAS), Bis(dimethylamino) silane (BDMAS), tris (dimethylamino) silane (Tris-DMAS), tetrakis(dimethylamino) silane (TDMAS), tris(ethlymethylamino) silane (Tris-EMAS), diethylaminod silane (DEAS), bis(tertybutylamino) silane (BTBAS), and di-isopropyl-amino-silane (DIPAS).

During the third stage, the temperature of the substrate 102 is alternated between the first temperature T1 and a second temperature T2 higher than the first temperature T1 but lower than the temperature T3 (third temperature hereinafter), for respective periods of time A and B. Also, the second time period B is shorter than the first time period A, and this process is repeated. The substrate 102 may be heated to the second temperature T2 during the entirety of each time period B or during only a portion of each time period B. In any case, the temperature of the substrate 102 is varied periodically between the first and the second temperatures T1 and T2.

When the temperature of the substrate 102 is at the first temperature T1 during a first time period A, the reaction source gas merely decomposes into the central atoms and ligands without any substantial deposition of the central atoms onto the substrate 102. That is, central atoms are merely absorbed by and detached from the substrate during the first time periods A of the third stage. As mentioned above, the first temperature may be in a range of about 400° C. to about 500° C.

Also, in the present embodiment, each first period of time A during which the substrate is heated to the first temperature T1 is in a range of about a few seconds to about several tens of seconds. This prevents any of the absorbed central atoms from migrating from locations adjacent the lateral portion of the exposed surface of the substrate 102 to locations adjacent the central portion thereof.

When the substrate 102 is heated to the second temperature T2 for a period of time B, the atoms at the surface of the substrate 102 are rearranged and the central atoms 30 are deposited on the exposed substrate 102, to thereby form single crystalline semiconductor material on the exposed surface of the substrate 102. That is, the second temperature T2 is high enough to cause rearrangement and a resulting combining of the central atoms with the substrate 102. In the present example embodiment, the second temperature T2 is in a range of about 700° C. to about 800° C.

The substrate 102 is heated to the second temperature T2 by both of the first and second heaters 18 and 20. That is, the temperature of the substrate 102 may be controlled by both of the first and the second heaters 18 and 20 during the third stage of the SEG process. In this respect, as described above, the second heater 20 can be effective to instantly increase the temperature of the substrate, even though operated for an extremely short period of time in a range of about a few microseconds to a few hundred microseconds, because the second heater 20 comprises an arc lamp or a laser provided as part of an annealing apparatus.

Even though the second temperature T2 is higher than the first temperature T1, the central atoms absorbed at the surface of the substrate 102 will not tend to migrate because the period of time B is relatively short, much more so than that of the first period of time A. That is, the atomistic mechanisms of rearrangement and resulting deposition occur with minimal atom migration. In this respect, experimental results have revealed that if the temperature T2 is within the range indicated above and the period of time B is longer than one second, atom migration is likely to occur. Accordingly, the period of time B is preferably in a range of about 1 microsecond to about 100 microseconds.

Figure 8A:
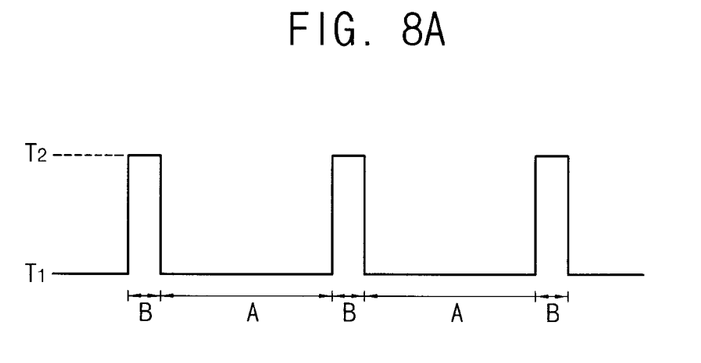
FIGS. 8A to 8C are diagrams of respective examples of the timing of the temperature control during the third stage of the SEG process.
Figure 8B:
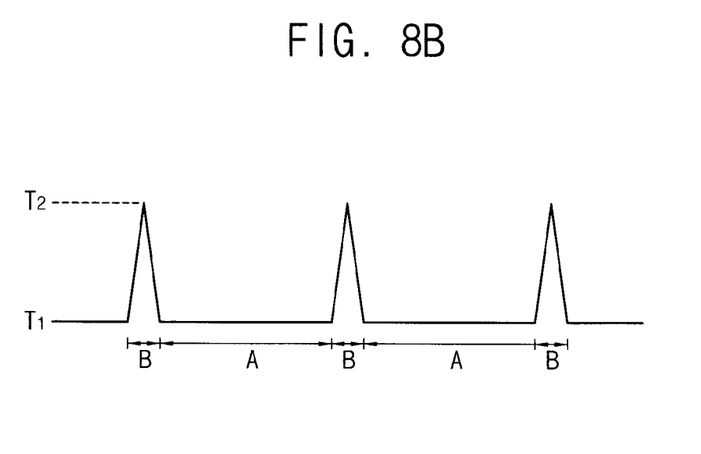
Figure 8C:
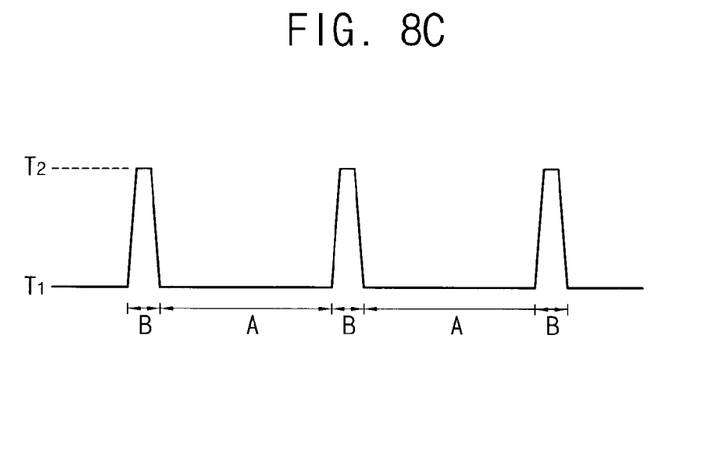

FIGS. 8A to 8C illustrate examples of the temperature profiles of the substrate during the third stage of the SEG process, on an enlarged scale.

In the example shown in FIG. 8A, the temperature of the substrate 102 may be ramped up to the second temperature T2 at the start of each second time period B and the second temperature T2 is maintained for the duration of the second time period B. Then, the temperature of the substrate 102 is ramped down to the first temperature T1 at the end of the second time period B.

In the example shown in FIG. 8B, the temperature of the substrate 102 is linearly increased at a constant rate to the second temperature T2 from the first temperature T1 and is then linearly decreased at the same rate to the first temperature T1 from the second temperature T2, all during each second time period B.

In the example shown in FIG. 8C, the temperature of the substrate 102 is linearly increased at a given rate to the second temperature T2 from the first temperature T1 beginning at the start of each second time period B, and the second temperature T2 is maintained for some finite amount of time during the second time period B. Then, the temperature of the substrate 102 is linearly decreased at the same rate, for example, from the second temperature T2 to the first temperature T1 and the arrival of the substrate at the first temperature T1 signals the end of the second time period B.

The number of first time periods A and B, i.e., the number of times the temperature of the substrate 102 is varied periodically during the course of the SEG process, will determine the thickness of the single crystalline semiconductor layer 106. Regardless of this number, atoms do not migrate across the surface of the layer being formed during the SEG process. Therefore, all of the exposed surfaces of the single crystalline semiconductor layer 106 have <100> crystallographic orientations and are hence, free of facet defects.

Figure 2:
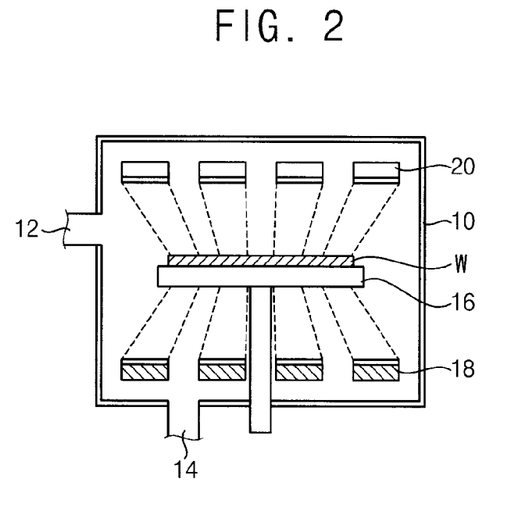
FIG. 2 is a cross-sectional view of apparatus for performing an SEG process for forming the thin layer structure shown in FIG. 1.
Figure 9:
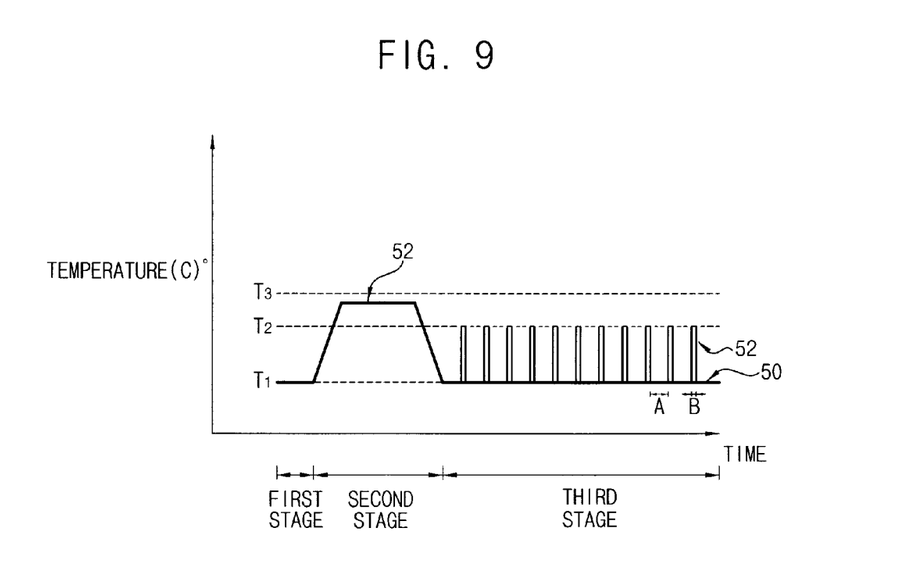
FIG. 9 is a timing diagram of another way in which the apparatus of FIG. 2 is operated to effect the temperature control in an SEG process of a method of forming a single crystalline semiconductor layer according to the inventive concept.

Another way of controlling the apparatus of FIG. 2 during the SEG process is illustrated by the timing diagram of FIG. 9. This control is similar to that shown in and described with reference to FIG. 7 with basically only the following exception.

Specifically, in this example, both of the first and the second heaters 18 and 20 are used to remove the native oxide layer from the surface of the substrate 102, in the second stage of the SEG process. Thus, the temperature of the first heater 18 may not be variable, and temperature variations during the SEG process are effected merely by operating the first heater 18 and controlling the second heater 20 only to vary its temperature output.

Figure 10:
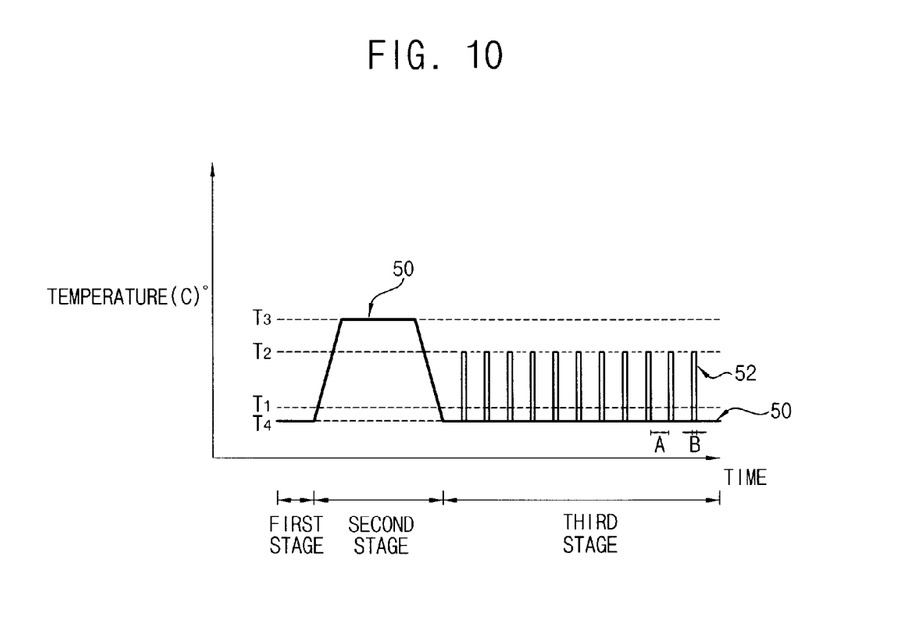
FIG. 10 is a timing diagram of still another way in which the apparatus of FIG. 2 is operated to effect temperature control of an SEG process in a method of forming the single crystalline semiconductor layer according to the inventive concept.

Yet another way of controlling the apparatus of FIG. 2 during the SEG process is shown in FIG. 10.

Referring to FIGS. 2 and 10, the substrate 102 is maintained at a constant temperature T4 lower than the first temperature T1 (at which the decomposition of the reaction source gas into central atoms and ligands tends to occur and rapidly accelerate) during the first stage of the SEG process to thereby thermally stabilize the substrate 102. In the example in which the substrate 102 comprises single crystalline silicon, the temperature T4 is preferably in a range of about 300° C. to about 400° C. Also, as shown in the figure, the substrate 102 may be heated to the temperature T4 by just the first heater 18, i.e., without turning on the second heater 20.

Then, a native oxide layer is removed from the surface of the substrate 102 by heat treating the substrate during a second stage of the SEG process. In this example, the native oxide layer may be removed by the same process as that described with reference to FIG. 7, except that the substrate 102 has to be heated much more because the stabilizing or pre-heating temperature of the substrate is lower in this example than in the first example shown in FIG. 7.

During the third stage of the SEG process, the temperature of the substrate 102 is varied between the fourth temperature T4 and the second temperature T2 for respective periods of time A and B. In all other respects, the third stage of the SEG process is similar to that of the first example shown in and described with reference to FIG. 7.

Figure 11:
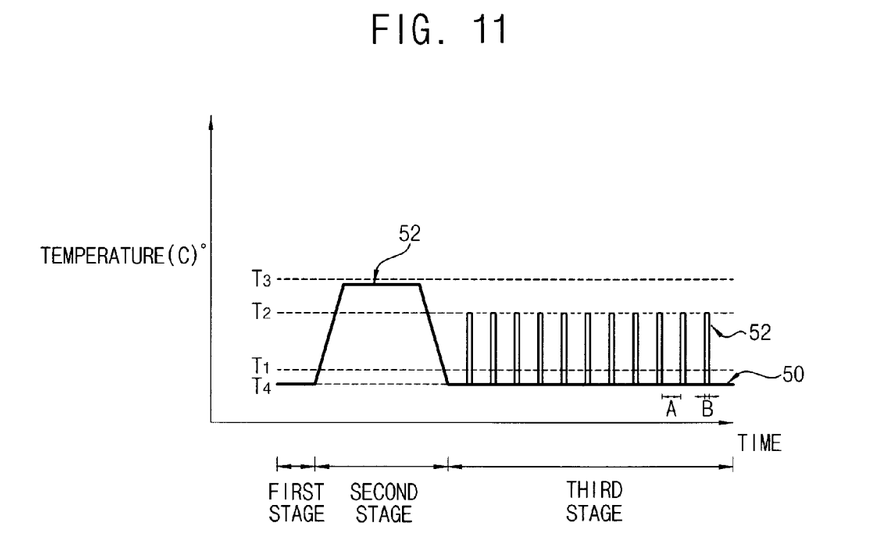
FIG. 11 is a timing diagram of still another way in which the apparatus of FIG. 2 is operated to effect temperature control of an SEG process in a method of forming a single crystalline semiconductor layer according to the inventive concept.

FIG. 11 shows still another example of the way in which the apparatus of FIG. 2 can be controlled to perform an SEG process in a method of forming a single crystalline semiconductor layer according to the inventive concept.

This example is similar to that of the example of FIG. 10 with the exception of the second stage in which a native oxide layer is removed from the surface of the substrate to facilitate a rapid growth of the single crystalline semiconductor layer 106. Specifically, in this example, the native oxide layer is removed by using both the first and second heaters 18 and 20

(as in the example of FIG. 9) to heat the substrate 102 to the third temperature T3 from the fourth temperature T4. Therefore, like the example of FIG. 9, in the deposition process for forming the single crystalline semiconductor layer (the third stage of the SEG process), the temperature of the substrate 102 is not varied by the first heater 18 but by merely operating the second heater 20 to vary the output thereof (by cycling the second heater 20 on and off, for example).

Next, an example of a semiconductor device including a thin layer structure of the type shown in and described with reference to FIG. 1, and a method of manufacturing the same will now be described in detail with reference to FIGS. 12 to 16.

Figure 12:
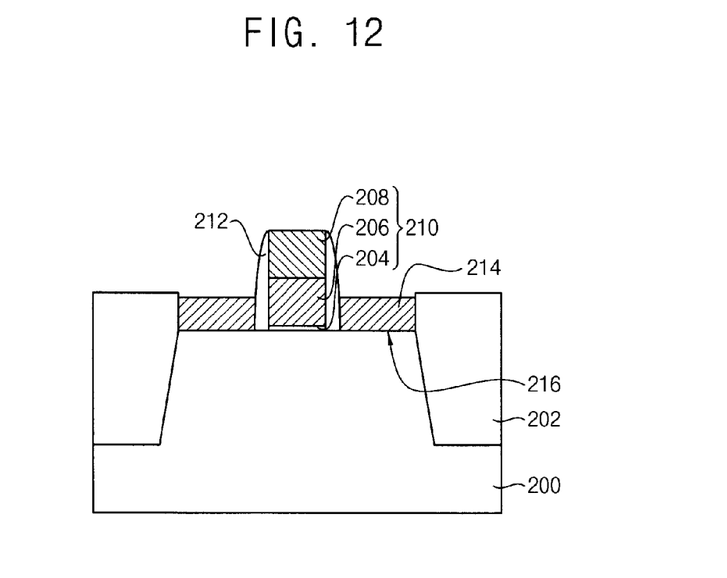
FIG. 12 is a cross-sectional view of a semiconductor device including a thin layer structure according to the inventive concept.

Referring first to FIG. 12, the semiconductor device includes a substrate 200 comprising semiconductor material such as single crystalline silicon (Si). Also, an upper surface of the substrate 200 has a substantially <100> crystallographic orientation.

The substrate 200 includes active regions, and a field region. Conductive structure(s) is/are disposed at an upper portion of each active region. The field region in this example contains a trench isolation structure. More specifically, a device isolation trench is provided in the field region of the substrate and a device isolation pattern 202 is disposed in the device isolation trench. Thus, conductive structure(s) at the upper portion of one active region are electrically isolated from the conductive structure(s) at the upper portion of another active region by the device isolation pattern 202.

One of the aforementioned conductive structures is a gate structure 210. In this example, the gate structure 210 includes a gate insulation pattern 204, a gate electrode 206 and a hard mask pattern 208 stacked on the active region of the substrate 200. A spacer 212 is provided on the sidewalls of the gate structure 210. The spacer 212 may be formed of silicon nitride.

A single crystalline semiconductor pattern 214 is provided on the substrate 200 between the device isolation pattern 202 and the spacer 212. The single crystalline semiconductor pattern 214 comprises silicon, i.e., one or more silicon (Si)-based materials. Examples of the silicon based material include pure silicon, silicon germanium (SiGe), and silicon carbide (SiC).

A method of manufacturing the semiconductor device illustrated in FIG. 12 will now be described with reference to FIGS. 13 to 16.

Figure 13:
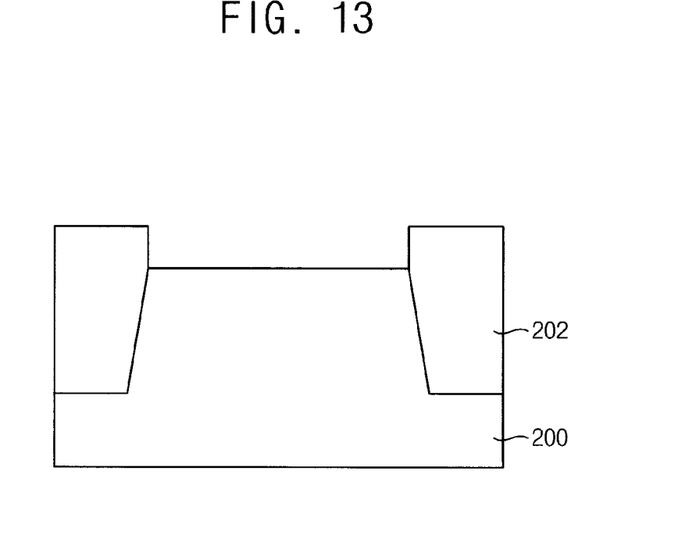
FIGS. 13 to 16 are cross-sectional views of a substrate illustrating steps in a method of manufacturing the semiconductor device illustrated in FIG. 12, according to the inventive concept.

Referring first to FIG. 13, field region is provided at an upper portion of the substrate 200 whose upper surface has a substantially <100> crystallographic orientation. For example, a mask (not illustrated) is formed on the substrate 200 in such a way that an active region(s) is/are covered by the etching mask. A region of the substrate constituting the field region is exposed by the mask and portion thereof is removed by etching the substrate using the mask as an etch mask. As a result, a device isolation trench is formed in the field region of the substrate 200. An insulation layer is then formed on the substrate 200 to a sufficient thickness as to fill the device isolation trench, and an upper portion of the insulation layer is then planarized until the upper surface of the substrate 200 is exposed. Thus, the portion of the insulation layer remaining in the device isolation trench forms the device isolation pattern 202.

Figure 14:
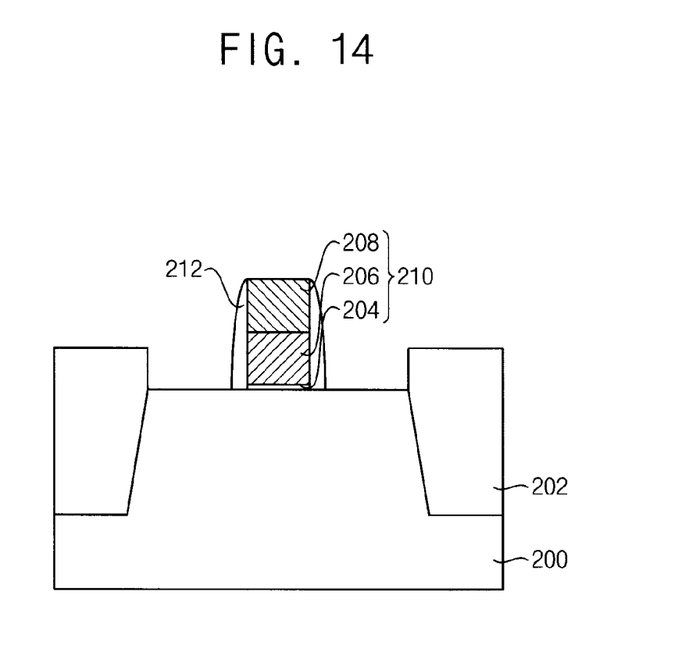

Referring to FIG. 14, a gate insulation layer (not illustrated), a gate electrode layer (not illustrated) and a hard mask layer (not illustrated) are sequentially formed on the substrate 200. The hard mask layer is patterned into a hard mask pattern 208 by photolithography and etching processes, and the gate insulation layer and the gate electrode layer are patterned into the gate insulation pattern 204 and the gate electrode 206 by an etching process using the hard mask pattern as an etching mask.

Next, a spacer layer (not illustrated) is formed on the substrate 200 and over sidewall surfaces and upper surface of the gate structure 210. The spacer layer is then anisotropically etched, thereby forming the spacer 212 on the sidewall surfaces of the gate structure 210.

Also, as a result, that part of the upper surface of the substrate 200 which is located between the spacer 212 and the device isolation pattern 202 is exposed.

Figure 15:
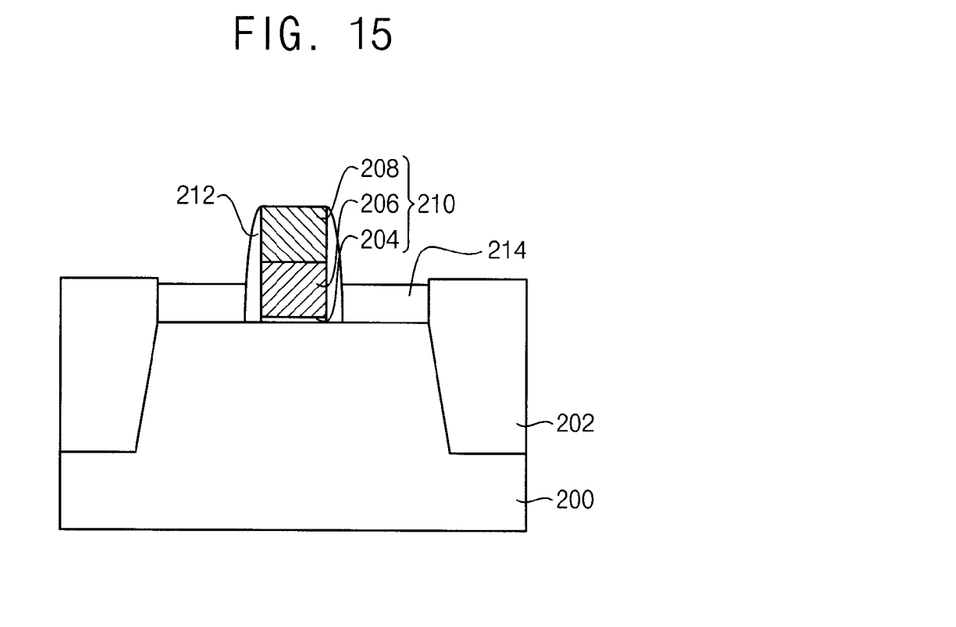

Referring to FIG. 15, the substrate 200 having the gate structure 210 and the spacer 212 thereon is loaded onto the susceptor 16 in the process chamber 10 of the apparatus of FIG. 2. Then, the apparatus is controlled, according to any of the control operations described above with reference to FIGS. 7-11, to perform an SEG process that forms a single crystalline semiconductor pattern 214 between the spacer 212 and the device isolation pattern 202. That is, a single crystalline semiconductor pattern 214 is grown in a gap between the spacer 212 and the device isolation pattern 202 using an SEG process in accordance with the inventive concept. Also, in this example, the upper surface of the device isolation pattern 202 is located at a level higher than that of the upper surface of the active region substrate 200 prior to the SEG process.

Accordingly, the single crystalline semiconductor pattern 214 has no facet defects at the sidewalls thereof, i.e., all of the surfaces of the single crystalline semiconductor pattern 214 (the sidewall surfaces as well as the upper surface thereof) have <100> crystallographic orientations.

Figure 16:
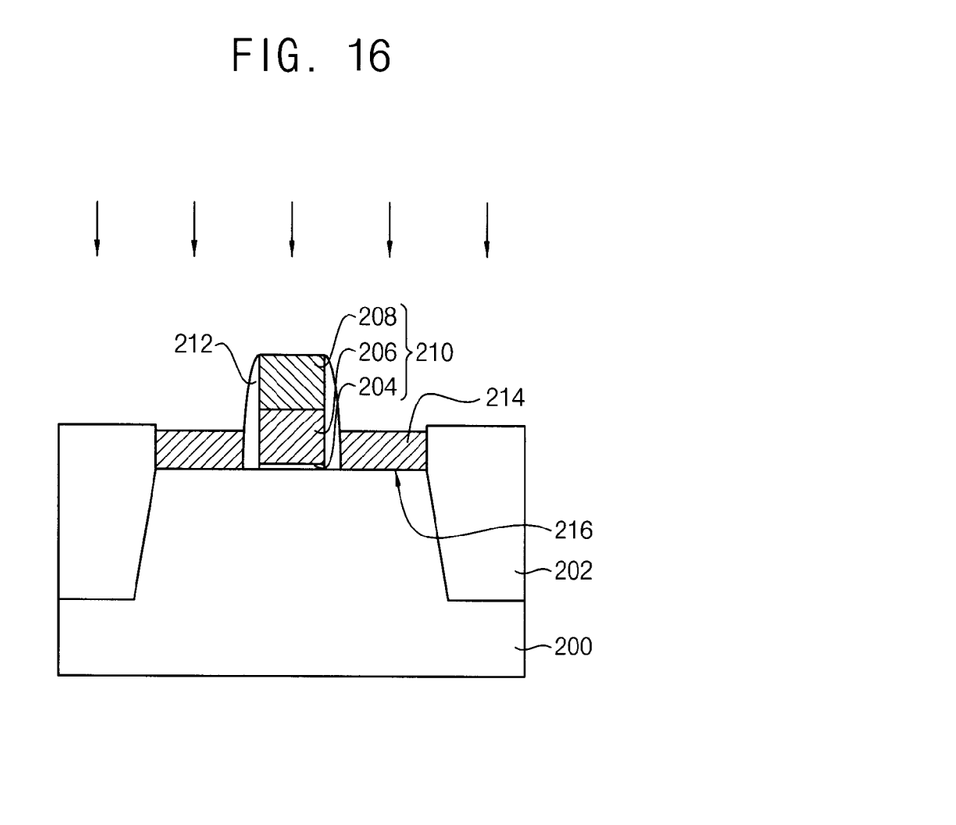

Referring to FIG. 16, impurities are then implanted onto the single crystalline semiconductor pattern 214 by an implantation process using the gate structure 210 and the spacer 212 as an implantation mask, thereby forming impurity regions 216 at the upper portion of the active region. The impurity region 216 may have a uniform doping profile because the single crystalline semiconductor pattern 214 has no defects such as facet defects and has the same <100> crystallographic orientation as the substrate 200.

Accordingly, a semiconductor device having an elevated impurity region of a thin layer of single crystalline semiconductor material may be provided according to the inventive concept. That is, an elevated MOS transistor can be formed according to the inventive concept. Such an elevated MOS transistor may have uniform and excellent operating characteristics because the elevated impurity region will have no facet defects.

According to the present inventive concept as described above, a thin layer structure may comprise a single crystalline semiconductor layer having no facet defects and whose surfaces all have a <100> crystallographic orientation. The thin layer structure may be employed by semiconductor devices in various ways. For example, the thin layer structure may be used as a channel region of a vertical semiconductor device, as an active region of a stacked semiconductor device or as a channel region of a pillar type of MOS transistor.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of forming a thin layer structure for a semiconductor device, comprising:
   forming at an upper portion of a substrate a pattern that exposes part of an upper surface of the substrate;
   loading the substrate having the pattern thereon onto a susceptor in a process chamber; and
   forming a layer on the exposed part of the surface of the substrate such that all outer surfaces of the layer have <100> crystallographic orientations, respectively, wherein the forming of the layer comprises a selective epitaxial growth (SEG) process performed on the substrate in the process chamber, and which SEG process includes:
   supplying reaction source gas into the process chamber, and
   effecting a temperature control over at least one cycle of a first time period and a second time period that follows the first time period chronologically, and
   wherein the duration of the second time period is shorter than that of the first time period,
   the temperature of the substrate is maintained at one temperature throughout the entire duration of the first time period, and
   the temperature of the substrate is raised from said one temperature to a second temperature during the course of the second time period.

2. The method of claim 1, wherein said one temperature is at least equal to that at which the reaction source gas decomposes into central atoms and ligands and the central atoms are absorbed by the exposed part of the upper surface of the substrate.

3. The method of claim 1, wherein the second temperature is one at which the central atoms physiochemically combine with the substrate.

4. The method of claim 1, wherein the duration of the second period of time is below that at which atomic migration will occur during the SEG process.

5. The method of claim 1, wherein the heating of the substrate to said one temperature comprises conductively heating the substrate by heating the susceptor with a first heater, and the heating of the substrate to the second temperature comprises heating an upper portion of the substrate radiantly with a second heater while the susceptor is being heated by the first heater.

6. The method of claim 1, further comprising removing a native oxide layer from the exposed part of the surface of the substrate through the pattern before the reaction source gas is supplied into the process chamber.

7. The method of claim 1, wherein the upper surface of the substrate is of single crystalline material comprising silicon, and the source gas comprises silicon and is selected such that the layer formed by the SEG process is a single crystalline layer comprising silicon.

8. The method of claim 4, wherein the duration of the second period of time is in a range of about 1 microsecond to about 100 microseconds.

9. The method of claim 5, wherein the first heater includes one of a halogen lamp and a hot plate, and the second heater includes one of an arc lamp and a laser annealing apparatus.

10. The method of claim 6, wherein the removing of the native oxide layer comprises:
   supplying reduction gas into the process chamber; and
   heating the substrate to a third temperature higher than the second temperature.

11. The method of claim 10, wherein the heating of the substrate to the third temperature comprises radiantly heating at least one of a rear portion of the susceptor and an upper portion of the substrate.

12. A method of forming a thin layer structure for a semiconductor device, comprising:
   loading a substrate whose upper surface is of single crystalline semiconductor material into a process chamber, and wherein one part of the upper surface of the substrate is exposed and another part thereof is covered by dielectric material;
   supplying into the process chamber reaction source gas comprising atoms to be deposited onto the exposed part of the upper surface of the substrate;
   preheating the substrate during an initial stage of a selective epitaxial growth (SEG) process; and
   subsequently, during another state of the selective epitaxial growth process, depositing the atoms from the reaction source gas onto the part of the upper surface of the substrate exposed by the dielectric material, by controlling the temperature of the substrate such that the temperature alternates between one temperature and a second temperature higher than said one temperature, and
   wherein the second temperature is one at which the atoms will be deposited onto the upper surface of the substrate,
   the temperature of the substrate is maintained at said one temperature during the entire course of each of several first time periods, each of the first time periods being of a first duration, and
   the substrate is heated to the second temperature from said one temperature during the course of each of several second time periods, each of the second time periods being of a second duration shorter than the first duration.

13. The method of claim 12, wherein the upper surface of the substrate is of single crystalline material comprising silicon, the source gas comprises silicon, said one temperature is in a range of from about 400° C. to about 500° C., and the second temperature is in a range of from about 700° C. to about 800° C.

14. The method of claim 12, wherein the maintaining of the temperature of the substrate at said one temperature comprises heating a susceptor on which the substrate is supported in the process chamber, and the heating of the substrate to the second temperature comprises directing radiant heat towards the upper surface of the substrate.

15. The method of claim 13, wherein the first duration is in a range of about a few seconds to about several tens of seconds, and the second duration is in a range of about 1 microsecond to about 100 microseconds.

16. The method of claim 14, wherein the heating of the substrate to said one temperature comprises heating the susceptor with a first heater, and the heating of the substrate to the second temperature comprises heating an upper portion of the substrate radiantly with a second heater, the thermal output of the first heater is maintained constant from the beginning of said initial stage of the SEG process through the end of said subsequent stage of the SEG process, and the thermal output of the second heater is varied over the course of said subsequent stage of the SEG process.

17. The method of claim 16, further comprising removing a native oxide layer from the exposed part of the surface of the substrate through the pattern after the initial stage of the SEG process and before the reaction source gas is supplied into the process chamber.

* * * * *